US008778224B2

(12) United States Patent
Bae et al.

(10) Patent No.: US 8,778,224 B2
(45) Date of Patent: Jul. 15, 2014

(54) FLUORESCENT DYE-SILOXANE HYBRID RESIN

(75) Inventors: Byeong-Soo Bae, Daejeon (KR); Seung-Yeon Kwak, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 231 days.

(21) Appl. No.: 13/331,864

(22) Filed: Dec. 20, 2011

(65) Prior Publication Data

US 2012/0153229 A1 Jun. 21, 2012

(30) Foreign Application Priority Data

Dec. 21, 2010 (KR) ........................ 10-2010-0131258

(51) Int. Cl.
*C09K 11/06* (2006.01)

(52) U.S. Cl.
USPC ........ 252/301.16; 136/257; 257/98; 313/503; 428/690; 8/647; 8/648; 556/435; 556/437; 556/413; 556/414; 556/415; 556/410; 556/411; 556/439; 556/442; 556/450; 556/455; 556/456; 556/459

(58) Field of Classification Search
USPC ............. 252/301.16; 556/435, 437, 413–415, 556/410, 411, 439, 442, 450, 455, 456, 556/459; 8/647, 648; 428/690; 313/503; 257/98; 136/257
See application file for complete search history.

(56) References Cited

U.S. PATENT DOCUMENTS

| | | | |
|---|---|---|---|
| 3,818,371 | A | 6/1974 | Herz et al. |
| 7,041,160 | B2 | 5/2006 | Feldkamp |

FOREIGN PATENT DOCUMENTS

| | | | |
|---|---|---|---|
| KR | 1020040074471 | A | 8/2004 |
| KR | 1020090031987 | A | 3/2009 |
| WO | WO 2008/138726 | * | 11/2008 |

* cited by examiner

*Primary Examiner* — Carol M Koslow
(74) *Attorney, Agent, or Firm* — The Webb Law Firm

(57) ABSTRACT

The present invention provides a fluorescent dye-silane hybrid resin manufactured by polycondensing an alkoxysilane bonded with a fluorescent dye with an organo-silane. More particularly, the present invention provides a fluorescent dye-siloxane hybrid resin that is manufactured by reacting a fluorescent dye having one or more functional groups with an alkoxysilane having an organic functional group to form an alkoxysilane bonded with the fluorescent dye and then polycondensing the alkoxysilane bonded with a fluorescent dye with an organo-silanediol and an organo-alkoxysilane having a thermocurable or ultraviolet-curable functional group without water. The fluorescent dye-silane hybrid resin has excellent thermostability, photostability, fluorescence characteristics, and processibility.

20 Claims, No Drawings

FLUORESCENT DYE-SILOXANE HYBRID RESIN

BACKGROUND OF THE INVENTION

1. Technical Field

The present invention relates to a fluorescent dye-silane hybrid resin manufactured by polycondensing alkoxysilane bonded with a fluorescent dye with organo-silane, by which the aggregation of a fluorescent dye is prevented, which has excellent thermostability, photostability, fluorescence characteristics, and processibility.

2. Description of the Related Art

A fluorescent dye has been variously and widely used in the fields of light wavelength converters, lasers, color filters, solar cells, LED devices, biomedics, special paints, etc. Generally, a fluorescent dye has a high absorption coefficient, wide absorption and emission spectra, and high quantum efficiency, compared to inorganic phosphor. Further, a fluorescent dye is advantageous in that it has high biochemical affinity and it is inexpensive. However, a fluorescent dye is problematic in that its thermostability and photostability are low compared to those of inorganic phosphor and in that, as its concentration increases, it aggregates or agglomerates due to its congenital properties, thus deteriorating dispersion stability. When a fluorescent dye aggregates or agglomerates, its fluorescence strength decreases, its color characteristics changes, and its optical transmittance decreases. Such problems greatly occur when a fluorescent dye is dispersed in an inorganic structure or a polymer resin such as an epoxy resin, a silicon resin or the like compared to when it is dispersed in a liquid solvent. Recently, attempts to disperse a fluorescent dye in a polymer resin and to put it to practical use have been widely conducted in academic circles and industries. Therefore, attempts to solve the above problem of aggregation of a fluorescent dye in a resin and to increase thermostability and photostability are required. U.S. Pat. Nos. 7,041,160 and 3,818,371 disclose a method of preventing the aggregation of a fluorescent dye and improving the dispersibility of a fluorescent dye by dispersing a fluorescent dye in a matrix using an additive or dispersant. However, when an additive or dispersant is used, there is a problem in that the stability and optical characteristics of a fluorescent dye deteriorate at the time of temperature increase. Meanwhile, Korean Unexamined Patent Publication No. 2004-0074471 discloses a fluorescent dye having a photocrosslinkable structure, and Korean Unexamined Patent Publication No. 2009-0031987 discloses a method of improving the stability of a fluorescent dye by introducing a cyclic structure as a partial structure of the fluorescent dye. However, since a new dye structure must be introduced in order to adjust the structure of a dye, various previously-developed dyes cannot be used.

SUMMARY OF THE INVENTION

Accordingly, the present invention has been devised to solve the above-mentioned problems, and an object of the present invention is to provide a fluorescent dye-siloxane hybrid resin that can prevent a fluorescent dye from aggregating and exhibit excellent thermostability, photostability, and fluorescence characteristics because a fluorescent dye is chemically bonded with siloxane having a compact inorganic network structure to allow the fluorescent dye to be surrounded by the network structure of siloxane to protect the fluorescent dye, and that can exhibit excellent processibility because it includes a thermocurable or ultraviolet-curable functional group.

In order to accomplish the above object, an aspect of the present invention provides a fluorescent dye-siloxane hybrid resin manufactured by polycondensing a mixture of an alkoxysilane bonded with a fluorescent dye and organo-alkoxysilane with organo-silanediol without water. The fluorescent dye-siloxane hybrid resin is manufactured by reacting a fluorescent dye having one or more functional groups with alkoxysilane having an organic functional group to form alkoxysilane bonded with the fluorescent dye and then polycondensing the alkoxysilane bonded with a fluorescent dye with organo-silanediol and organo-alkoxysilane having a thermocurable or ultraviolet-curable functional group without water. The fluorescent dye-siloxane hybrid resin can prevent a fluorescent dye from aggregating and exhibit excellent thermostability, photostability, and fluorescence characteristics because the fluorescent dye is chemically bonded with siloxane having a compact inorganic network structure to allow the fluorescent dye to be surrounded by the network structure of siloxane to protect the fluorescent dye, and can exhibit excellent processibility because it has a thermocurable or ultraviolet-curable functional group.

DESCRIPTION OF THE PREFERRED EMBODIMENTS

Hereinafter, the present invention will be described in detail.

The fluorescent dye-siloxane hybrid resin according to the present invention is manufactured by a sol-gel reaction. Particularly, as shown in Reaction Formula 1 below, the polycondensation reaction of an alkoxysilane bonded with a fluorescent dye and organo-alkoxysilane with organo-silanediol without water is conducted by a nonaqueous sol-gel reaction without the addition of water. Since the nonaqueous sol-gel reaction of the present invention, unlike a conventional sol-gel reaction, is conducted by the polycondensation reaction of organo-alkoxysilane and organo-silanediol without the addition of water, the amount of hydroxy groups existing in a raw material can be controlled to improve the stability of the raw material, and the fluorescent dye-siloxane hybrid resin can be manufactured using various precursors as well as composite oxides.

[Reaction Formula 1]

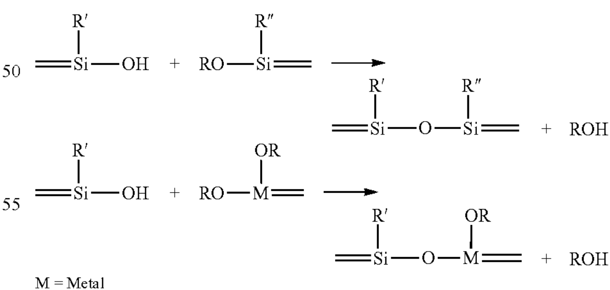

As shown in Reaction Formula 1 above, when a hydroxy group of organo-silanediol as a starting material is polycondensed with an alkoxy group of organo-alkoxysilane bonded with a fluorescent dye, a fluorescent dye-siloxane hybrid resin, having an inorganic network structure around which organic groups such as R', R", and the like are modified, is formed.

When a fluorescent dye-siloxane hybrid resin is manufactured using a nonaqueous sol-gel reaction, since the fluorescent dye-siloxane hybrid resin is formed by the polycondensation reaction of organo-alkoxysilane and organo-silane having a modified hydroxy group, a catalyst may be added in order to lower reaction temperature and accelerate a sol-gel reaction. As the catalyst, a metal hydroxide such as barium hydroxide, strontium hydroxide, or the like can be used. The amount of the catalyst is not particularly limited, and may be 0.0001~10 mol %. The polycondensation reaction is sufficiently conducted by stirring reactants for 6~72 hours. The polycondensation reaction is conducted at 0~100° C., preferably 40~80° C., for 1~24 hours in order to form an inorganic network structure.

Further, alcohol exists in the fluorescent dye-siloxane hybrid resin manufactured by the polycondensation reaction. The alcohol can be removed by treating the fluorescent dye-siloxane hybrid resin under the condition of a temperature of 0~120° C. and atmospheric pressure or reduced pressure, preferably under the condition of a temperature of 40~80° C. and a pressure of −0.1 MPa, for 10 minutes~1 hour.

The alkoxysilane bonded with a fluorescent dye is prepared by the reaction of a fluorescent dye having at least one functional group and alkoxysilane having an organic functional group. In the present invention, the alkoxysilane bonded with a fluorescent dye may be selected from alkoxysilanes bonded with a fluorescent dye, respectively prepared by the following methods 1) to 5), and mixtures thereof.

1) The alkoxysilane bonded with a fluorescent dye is prepared by reacting a fluorescent dye having a hydroxy group with a compound represented by Chemical Formula 1 or a mixture thereof:

[Chemical Formula 1]

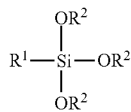

wherein $R_1$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_1$ has at least one functional group selected from an isocyanate group, an alkoxy group of C1~C20, and a hydroxy group; and $R_2$ is a linear or branched alkyl group of C1~C7.

2) The alkoxysilane bonded with a fluorescent dye is prepared by reacting a fluorescent dye having at least one selected from a carboxylic group, a urethane group, and a urea group with a compound represented by Chemical Formula 2 or a mixture thereof:

[Chemical Formula 2]

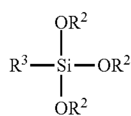

wherein $R_3$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_3$ has an isocyanate group as a functional group; and $R_2$ is a linear or branched alkyl group of C1~C7.

3) The alkoxysilane bonded with a fluorescent dye is prepared by reacting a fluorescent dye having at least one selected from a primary amino group, a secondary amino group, and a tertiary amino group with a compound represented by Chemical Formula 3 or a mixture thereof:

[Chemical Formula 3]

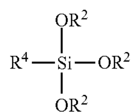

wherein $R_4$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_4$ has at least one functional group selected from an isocyanate group, an isothiocyanate group, an epoxy group, a halide group and a carbonyl group; and $R_2$ is a linear or branched alkyl group of C1~C7.

4) The alkoxysilane bonded with a fluorescent dye is prepared by reacting a fluorescent dye having a cyano group with a compound represented by Chemical Formula 4 or a mixture thereof:

[Chemical Formula 4]

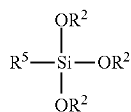

wherein $R_5$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_5$ has at least one functional group selected from an amino group, an alkene group and a halide group; and $R_2$ is a linear or branched alkyl group of C1~C7.

5) The alkoxysilane bonded with a fluorescent dye is prepared by reacting a fluorescent dye having an isothiocyanate group with a compound represented by Chemical Formula 5 or a mixture thereof:

[Chemical Formula 5]

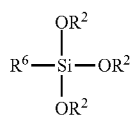

wherein $R_6$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_6$ has an amino group as a functional group; and $R_2$ is a linear or branched alkyl group of C1~C7.

The organo-alkoxysilane, which is a silane compound bonded with an organic chain substituted or unsubstituted with a functional group and an alkoxy group, may be a compound represented by Chemical Formula 6 or a mixture thereof:

[Chemical Formula 6]

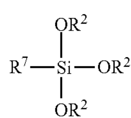

wherein $R_7$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_7$ has at least one functional group selected from an acryl group, a methacryl group, a vinyl group and an epoxy group; and $R_2$ is a linear or branched alkyl group of C1~C7.

More concretely, the organo-alkoxysilane may be selected from 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, vinyltriethoxysilane, vinyltripropoxysilane, N-(3-acryloxy-2-hydroxypropyl)-3-aminopropyltriethoxysilane, N-(3-acryloxy-2-hydroxypropyl)-3-aminopropyltrimethoxysilane, N-(3-acryloxy-2-hydroxypropyl)-3-aminopropyltripropoxysilane, 3-acryloxypropylmethylbis(trimethoxy)silane, 3-acryloxypropyltrimethoxysilane, 3-acryloxypropyltriethoxysilane, 3-acryloxypropyltripropoxysilane, 3-(meth)acryloxypropyltrimethoxysilane, 3-(meth)acryloxypropyltriethoxysilane, 3-(meth)acryloxypropyltripropoxysilane, and a mixture thereof. However, the present invention is not limited thereto.

The organo-silanediol, which is a silane compound bonded with an organic chain substituted or unsubstituted with a functional group and two hydroxy groups, may be a compound represented by Chemical Formula 7 or a mixture thereof:

[Chemical Formula 7]

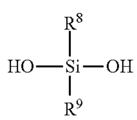

wherein $R_8$ and $R_9$ are each independently selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_8$ and $R_9$ each independently have at least one functional group selected from an acryl group, a methacryl group, an allyl group, a halogen group, an amino group, a mercapto group, an ether group, an ester group, an alkoxy group of C1~C20, a sulfone group, a nitro group, a hydroxy group, a cyclobutene group, a carbonyl group, a carboxyl group, an alkyd group, a urethane group, a vinyl group, a nitrile group, and an epoxy.

More concretely, the organo-silanediol may be selected from diphenylsilanediol, diisobutylsilanediol, and a mixture thereof. However, the present invention is not limited thereto.

In order to adjust the viscosity of the fluorescent dye-siloxane hybrid resin and improve the stability thereof, a solvent may be added. Examples of the solvent that can be used in the present invention may include, but are not limited to, aliphatic hydrocarbon-based solvents, such as hexane, heptane, etc; ketone-based solvents, such as methyl isobutyl ketone, 1-methyl-2-pyrolidinone, cyclohexanone, acetone, etc; ether-based solvents, such as tetrahydrofuran, isopropyl ether, propylene glycol propyl ether, etc; acetate-based solvents, such as ethyl acetate, butyl acetate, propylene glycol methyl ether acetate, etc; alcohol-based solvents, such as isopropyl alcohol, butyl alcohol, etc.; amide-based solvents, such as dimethylacetamide, diemthylformamide, etc.; silicon-based solvents; and mixtures thereof.

The fluorescent dye-siloxane hybrid resin may include one or more selected from the group consisting of a quantum dot, inorganic phosphor, a conjugated polymer, a surfactant, an antioxidant, an active oxygen remover, silica sol, oxide or nitride nanoparticles, a flameproofing agent, a metal filler, and a heat-resisting agent as long as they does not influence the effect of the present invention.

In the fluorescent dye-siloxane hybrid resin of the present invention, when a thermocurable or ultraviolet-curable functional group is modified, thermocuring or ultraviolet-curing may be conducted. When the fluorescent dye-siloxane hybrid resin has a thermocurable or ultraviolet-curable functional group, the density, free volume, adhesivity to a substrate, refractive index, and the like thereof can be adjusted by adding a monomer having a thermocurable or ultraviolet-curable functional group or mixing different kinds of functional groups.

Further, in the manufacture of the fluorescent dye-siloxane hybrid resin, when organo-alkoxysilane or organo-silanediol has a thermocurable or ultraviolet-curable functional group such as an epoxy group, an acryl group, a methacryl group, a vinyl group, an amino group, a hydroxy group, or the like, the manufactured fluorescent dye-siloxane hybrid resin may be thermocured or ultraviolet-cured. The thermocuring or ultraviolet-curing may be conducted under a commonly-used catalyst. After the thermocuring or ultraviolet-curing, the fluorescent dye-siloxane hybrid resin may be heat-treated at 180° C. or less, concretely 50~180° C., and preferably at 150° C. or less, concretely 50~150° C.

The fluorescent dye-siloxane hybrid resin of the present invention can be used to manufacture a light wavelength converter, laser, color filter, solar cell, LED device, or the like.

Hereinafter, the present invention will be described in more detail with reference to the following Examples. However, the scope of the present invention is not limited thereto.

Example 1

7-amino-4-methylcoumarin (coumarin 120) and 3-isocyanatepropyltriethoxysilane were put into a 10 mL glass bottle at a molar ratio of 1:1, the glass bottle was closed by a cover, and then the mixture was reacted for 2 hours at room temperature using a magnetic stirrer. The amino group of 7-amino-4-methylcoumarin was reacted with the isocyanate group of 3-isocyanatepropyltriethoxysilane to obtain an alkoxysilane bonded with coumarin. This alkoxysilane bonded with coumarin was put into a 200 mL flask together with 2-(3,4-epoxycyclohexyl)ethyltrimethoxysilane and diphenylsilanediol at a molar ratio of 0.001:2:3, barium hydroxide, as a catalyst, was added in an amount of 0.1 mol % based on silane, and then the resulting mixture was stirred for 4 hours at 80° C. to obtain a coumarin-siloxane hybrid resin having blue fluorescence. Subsequently, an allylsulfonium hexafluoroantimony salt, as a photocuring catalyst, was added to the obtained coumarin-siloxane hybrid resin in an amount of 4 wt % based on an organo-oligosiloxane resin, and then this coumarin-siloxane hybrid resin was put into a plastic frame having a thickness of 1 mm. Then, the coumarin-siloxane hybrid resin was photocured by exposing it to an ultraviolet lamp having a wavelength of 365 nm for 1 minute.

After the photocuring, the plastic frame was removed, and the coumarin-siloxane hybrid resin was additionally cured for 2 hours at 120° C.

Example 2

2-(6-amino-3-imino-3H-xanthene-9-yl)benzoic acid methyl ester (rhodamine 123) and 3-isocyanatepropyltriethoxysilane were put into a 10 mL glass bottle at a molar ratio of 1:1, the glass bottle was closed by a cover, and then the mixture was reacted for 2 hours at room temperature using a magnetic stirrer. The amino group of 2-(6-amino-3-imino-3H-xanthene-9-yl)benzoic acid methyl ester was reacted with the isocyanate group of 3-isocyanatepropyltriethoxysilane to obtain an alkoxysilane bonded with rhodamine. This alkoxysilane bonded with rhodamine was put into a 200 mL flask together with 3-glycidoxypropyltrimethoxysilane and diphenylsilanediol at a molar ratio of 0.001:2:3, barium hydroxide, as a catalyst, was added in an amount of 0.1 mol % based on silane, and then the resulting mixture was stirred for 4 hours at 80° C. to obtain a rhodamine-siloxane hybrid resin having green fluorescence. Subsequently, phthalic anhydride, as a thermocuring catalyst, was added to the obtained rhodamine-siloxane hybrid resin in an amount of 1 mol per equivalent of an organo-oligosiloxane, and then this rhodamine-siloxane hybrid resin was put into a polymer-coated glass frame having a thickness of 1 mm. Then, the rhodaime-siloxane hybrid resin was thermocured for 2 hours at 200° C. After the thermocuring, the glass frame was removed.

Example 3

Fluorescein and 3-isocyanatepropyltriethoxysilane were put into a 10 mL glass bottle at a molar ratio of 1:2, the glass bottle was closed by a cover, and then the mixture was reacted for 2 hours at 70° C. using a magnetic stirrer. The hydroxy group of fluorescein was reacted with the isocyanate group of 3-isocyanatepropyltriethoxysilane to obtain an alkoxysilane bonded with fluorescein. This alkoxysilane bonded with fluorescein was put into a 200 mL flask together with 3-methacrylpropyltrimethoxysilane and diphenylsilanediol at a molar ratio of 0.001:2:3, barium hydroxide, as a catalyst, was added in an amount of 0.1 mol % based on silane, and then the resulting mixture was stirred for 4 hours at 80° C. to obtain a fluorescein-siloxane hybrid resin having green fluorescence. Subsequently, 1,6-hexanedioldiacrylate was added to the obtained fluorescein-siloxane hybrid resin in an equivalent ratio, 2,2-dimethoxy-2-phenylacetophenone, as a photocuring catalyst, was added to the fluorescein-siloxane hybrid resin in an amount of 2 wt % based on an organo-oligosiloxane resin, and then this fluorescein-siloxane hybrid resin was put into a plastic frame having a thickness of 1 mm. Then, the fluorescein-siloxane hybrid resin was photocured by exposing it to an ultraviolet lamp having a wavelength of 365 nm for 4 minutes. After the photocuring, the plastic frame was removed, and the fluorescein-siloxane hybrid resin was additionally cured for 2 hours at 120° C.

Example 4

4-(dicyanomethylene)-2-methyl-6-(4-dimethylaminostyryl)-4H-pyran modified with hydroxy group (DCM-OH) and 3-isocyanatepropyltriethoxysilane were put into a 10 mL glass bottle at a molar ratio of 1:2, the glass bottle was closed by a cover, and then the mixture was reacted for 6 hours at 60° C. using a magnetic stirrer. The hydroxy group of DCM was reacted with the isocyanate group of 3-isocyanatepropyltriethoxysilane to obtain an alkoxysilane bonded with DCM. This alkoxysilane bonded with DCM was put into a 200 mL flask together with vinyltrimethoxysilane and diphenylsilanediol at a molar ratio of 0.001:2:3, barium hydroxide, as a catalyst, was added in an amount of 0.1 mol % based on silane, and then the resulting mixture was stirred for 4 hours at 80° C. to obtain a DCM-siloxane hybrid resin having red fluorescence. Subsequently, trimethylolpropane triacrylate was added to the obtained DCM-siloxane hybrid resin in an equivalent ratio, benzoyl peroxide, as a photocuring catalyst, was added to the DCM-siloxane hybrid resin in an amount of 4 wt % based on an organo-oligosiloxane resin, and then this DCM-siloxane hybrid resin was put into a plastic frame having a thickness of 1 mm. Then, the DCM-siloxane hybrid resin was photocured by exposing it to an ultraviolet lamp having a wavelength of 365 nm for 4 minutes. After the photocuring, the plastic frame was removed, and the DCM-siloxane hybrid resin was additionally cured for 2 hours at 120° C.

Example 5

2,5-diamino-3,6-dicyanopyrazine and 3-aminopropyltrimethoxysilane were put into a 10 mL glass bottle at a molar ratio of 1:2, the glass bottle was closed by a cover, and then the mixture was reacted for 24 hours at 70° C. using a magnetic stirrer. The cyano group of 2,5-diamino-3,6-dicyanopyrazine was reacted with the amino group of 3-aminopropyltrimethoxysilane to obtain an alkoxysilane bonded with 2,5-diamino-3,6-dicyanopyrazine. This alkoxysilane bonded with 2,5-diamino-3,6-dicyanopyrazine was put into a 200 mL flask together with vinyltrimethoxysilane and diphenylsilanediol at a molar ratio of 0.001:2:3, barium hydroxide, as a catalyst, was added in an amount of 0.1 mol % based on silane, and then the resulting mixture was stirred for 4 hours at 80° C. to obtain a 2,5-diamino-3,6-dicyanopyrazine-siloxane hybrid resin having green fluorescence. Subsequently, trimethylolpropane triacrylate was added to the obtained 2,5-diamino-3,6-dicyanopyrazine-siloxane hybrid resin in an equivalent ratio, benzoyl peroxide, as a photocuring catalyst, was added to the 2,5-diamino-3,6-dicyanopyrazine-siloxane hybrid resin in an amount of 4 wt % based on an organo-oligosiloxane resin, and then this 2,5-diamino-3,6-dicyanopyrazine-siloxane hybrid resin was put into a plastic frame having a thickness of 1 mm. Then, the 2,5-diamino-3,6-dicyanopyrazine-siloxane hybrid resin was photocured by exposing it to an ultraviolet lamp having a wavelength of 365 nm for 4 minutes. After the photocuring, the plastic frame was removed, and the 2,5-diamino-3,6-dicyanopyrazine-siloxane hybrid resin was additionally cured for 2 hours at 120° C.

Example 6

Fluorescein-5(6)-isothiocyanate (FITC) and 3-aminopropyltrimethoxysilane were put into a 10 mL glass bottle at a molar ratio of 1:1, the glass bottle was closed by a cover, and then the mixture was reacted for 4 hours at room temperature using a magnetic stirrer. The isothiocyanate group of FITC was reacted with the amino group of 3-aminopropyltrimethoxysilane to obtain alkoxysilane bonded with FITC. This alkoxysilane bonded with FITC was put into a 200 mL flask together with 2-(3,4-epoxycyclohexyl)ethyltrimethoxysilane and diphenylsilanediol at a molar ratio of 0.001:2:3, barium hydroxide, as a catalyst, was added in an amount of 0.1 mol % based on silane, and then the mixture was stirred for 72 hours at 80° C., propylene glycol methyl ether acetate was added, and the resulting mixture was reacted for 30 minutes at a pressure of −0.1 MPa and a temperature of 60° C., and then methanol was removed therefrom using a reduced-pressure evaporator to obtain a FITC-siloxane hybrid resin having green fluorescence. Subsequently, phthalic anhydride, as a thermocuring catalyst, was added to the obtained FITC-siloxane hybrid resin in an amount of 1 mol per equivalent of an organo-oligosiloxane, and then this FITC-siloxane hybrid resin was put into a polymer-coated glass frame having a thickness of 1 mm. Then, the FITC-siloxane hybrid resin was thermocured for 2 hours at 200° C. After the thermocuring, the glass frame was removed.

Evaluation

The sample obtained from Example 4 was evaluated as follows.

(a) Photostability

The sample was exposed to a lamp having a wavelength of 365 nm for 20 hours, and then the fluorescence strength thereof was measured using a fluorometric analyzer (DARSA PRO 5100, manufactured by PSI Co., Ltd.).

(b) Thermostability

The sample was left in an oven at 120° C. for 600 hours, and then the fluorescence strength thereof was measured using a fluorometric analyzer (DARSA PRO 5100, manufactured by PSI Co., Ltd.).

(c) Stability to the Aggregation of Fluorescent Dye

The sample was manufactured while increasing the concentration of fluorescent dye, and then the fluorescence strength thereof was measured using a fluorometric analyzer (DARSA PRO 5100, manufactured by PSI Co., Ltd.).

TABLE 1

Comparison of fluorescence strength of fluorescent dye-siloxane hybrid resin with that of a control group before and after heat treatment

| Heating time at 120° C. | 0 hour | 24 hours | 72 hours | 144 hours | 300 hours | 600 hours |
|---|---|---|---|---|---|---|
| Fluorescent dye-siloxane hybrid resin | 100% | 100% | 98.5% | 99.5% | 100% | 99.4% |
| Control group | 100% | 85.8% | 80.2% | 79.4% | 65.1% | 5837% |

TABLE 2

Comparison of fluorescence strength of fluorescent dye-siloxane hybrid resin with that of a control group according to the concentration of fluorescent dye (comparison of stability to the aggregation of fluorescent dye).

| Concentration (mM) | 0.1 | 0.25 | 0.5 | 1.0 | 2.0 | 3.0 |
|---|---|---|---|---|---|---|
| Fluorescent dye-siloxane hybrid resin | 14000 | 27798 | 30485 | 31359 | 31777 | 31554 |
| Control group | 14850 | 13456 | 12634 | 12508 | 8553 | 5000 |

[Table 1] shows the comparison of fluorescence strength of a fluorescent dye-siloxane hybrid resin of Example 4 with that of a control group before and after heat treatment. The control group is a sample manufactured by mixing a commonly-used epoxy polymer with a fluorescent dye having the same concentration as that of the fluorescent dye of the fluorescent dye-siloxane hybrid resin and then curing the mixture. From Table 1, it can be ascertained that, when the fluorescent dye-siloxane hybrid resin and the control group are continuously exposed at 120° C., the control group is deteriorated by heat, thus decreasing the fluorescence strength thereof, whereas the fluorescence characteristics of the fluorescent dye-siloxane hybrid resin hardly changes.

[Table 2] shows the comparison of stability of a fluorescent dye-siloxane hybrid resin of Example 4 to the aggregation of a fluorescent dye with that of a control group to the aggregation of a fluorescent dye according to the concentration of a fluorescent dye. The control group is a sample manufactured by simply mixing a siloxane resin with a fluorescent dye having the same concentration as that of the fluorescent dye of the fluorescent dye-siloxane hybrid resin and then curing the mixture. From Table 2, it can be seen that, as the concentration of a fluorescent dye increases from 0.1 mM to 3 mM, the florescence strength of the fluorescent dye-siloxane hybrid resin continuously increases, whereas the fluorescence strength of the control group decreases. Therefore, it can be determined that the fluorescence strength of the control group is decreased because the fluorescent dye aggregates at a high concentration, whereas the florescence strength of fluorescent dye-siloxane hybrid resin is increased because the fluorescent dye does not aggregate even at a high concentration. In conclusion, it can be ascertained that the fluorescent dye-siloxane hybrid resin of the present invention can prevent the aggregation of the fluorescent dye and exhibit excellent thermostability, photostability, and fluorescence characteristics.

As described above, the fluorescent dye-siloxane hybrid resin of the present invention can prevent a fluorescent dye from aggregating and exhibit excellent thermostability, photostability, and fluorescence characteristics because the fluorescent dye is chemically bonded with siloxane having a compact inorganic network structure to allow the fluorescent dye to be surrounded by the network structure of siloxane to protect the fluorescent dye, and can exhibit excellent processibility because it has a thermocurable or ultraviolet-curable functional group.

Further, the fluorescent dye-siloxane hybrid resin of the present invention has high stability, excellent thermal and mechanical properties, and high optical transmittance because organic components and inorganic components are uniformly mixed at the molecular level. Further, it is possible to adjust the various physical properties such as refractive index and the like of the fluorescent dye-siloxane hybrid resin of the present invention because various organic groups or organic functional groups can be provided to the fluorescent dye-siloxane hybrid resin.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A fluorescent dye-siloxane hybrid resin manufactured by polycondensing a mixture of an alkoxysilane bonded with a fluorescent dye and an organo-alkoxysilane with organo-silanediol without water.

2. The fluorescent dye-siloxane hybrid resin according to claim 1, wherein the alkoxysilane bonded with a fluorescent dye is prepared by reacting a fluorescent dye having a hydroxy group with a compound represented by Chemical Formula 1 or a mixture thereof:

[Chemical Formula 1]

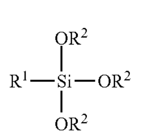

wherein $R_1$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_1$ has at least one functional group selected from an isocyanate group, an alkoxy group of C1~C20, and a hydroxy group; and $R_2$ is a linear or branched alkyl group of C1~C7.

3. The fluorescent dye-siloxane hybrid resin according to claim 1, wherein the alkoxysilane bonded with a fluorescent dye is prepared by reacting a fluorescent dye having at least one selected from a carboxylic group, a urethane group, and a urea group with a compound represented by Chemical Formula 2 or a mixture thereof:

[Chemical Formula 2]

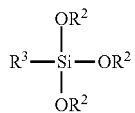

wherein $R_3$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_3$ has an isocyanate group as a functional group; and $R_2$ is a linear or branched alkyl group of C1~C7.

4. The fluorescent dye-siloxane hybrid resin according to claim 1, wherein the alkoxysilane bonded with a fluorescent dye is prepared by reacting a fluorescent dye having at least one selected from a primary amino group, a secondary amino group, and a tertiary amino group with a compound represented by Chemical Formula 3 or a mixture thereof:

[Chemical Formula 3]

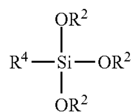

wherein $R_4$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_4$ has at least one functional group selected from an isocyanate group, an isothiocyanate group, an epoxy group, a halide group, and a carbonyl group; and $R_2$ is a linear or branched alkyl group of C1~C7.

5. The fluorescent dye-siloxane hybrid resin according to claim 1, wherein the alkoxysilane bonded with a fluorescent dye is prepared by reacting a fluorescent dye having a cyano group with a compound represented by Chemical Formula 4 or a mixture thereof:

[Chemical Formula 4]

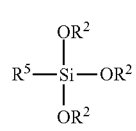

wherein $R_5$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_5$ has at least one functional group selected from an amino group, an alkene group, and a halide group; and $R_2$ is a linear or branched alkyl group of C1~C7.

6. The fluorescent dye-siloxane hybrid resin according to claim 1, wherein the alkoxysilane bonded with a fluorescent dye is prepared by reacting a fluorescent dye having an isothiocyanate group with a compound represented by Chemical Formula 5 or a mixture thereof:

[Chemical Formula 5]

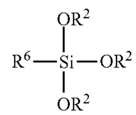

wherein $R_6$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_6$ has an amino group as a functional group; and $R_2$ is a linear or branched alkyl group of C1~C7.

7. The fluorescent dye-siloxane hybrid resin according to claim 1, wherein the alkoxysilane bonded with a fluorescent dye comprises a mixture of at least two of the alkoxysilanes of claims 2 to 6.

8. The fluorescent dye-siloxane hybrid resin according to claim 1, wherein the fluorescent dye has at least one selected from 2-(6-amino-3-imino-3H-xanthene-9-yl)benzoic acid methyl ester, 7-amino-4-methylcoumarin, fluorescein, 4-dicyanomethylene-2-methyl-6-p-dimethylaminostyryl-4H-pyran (DCM), 2,5-diamino-3,6-dicyanopyrazine, and fluorescein-5(6)-isothiocyanate.

9. The fluorescent dye-siloxane hybrid resin according to claim 1, wherein the organo-alkoxysilane is a compound represented by Chemical Formula 6 or a mixture thereof:

[Chemical Formula 6]

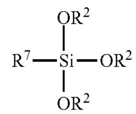

wherein $R_7$ is selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_7$ has at least one functional group selected from an acryl group, a methacryl group, a vinyl group, and an epoxy group; and $R_2$ is a linear or branched alkyl group of C1~C7.

10. The fluorescent dye-siloxane hybrid resin according to claim 9, wherein the organo-alkoxysilane is selected from 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, vinyltriethoxysilane, vinyltripropoxysilane, N-(3-acryloxy-2-hydroxypropyl)-3-aminopropyltriethoxysilane, N-(3-acryloxy-2-hydroxypropyl)-3-aminopropyltrimethoxysilane, N-(3-acryloxy-2-hydroxypropyl)-3-aminopropyltripropoxysilane, 3-acryloxypropylmethylbis(trimethoxy)silane, 3-acryloxypropyltrimethoxysilane, 3-acryloxypropyltriethoxysilane, 3-acryloxypropyltripropoxysilane, 3-(meth)acryloxypropyltrimethoxysilane, 3-(meth)acryloxypropyltriethoxysilane, 3-(meth)acryloxypropyltripropoxysilane, and a mixture thereof.

11. The fluorescent dye-siloxane hybrid resin according to claim 1, wherein the organo-silanediol is a compound represented by Chemical Formula 7 or a mixture thereof:

[Chemical Formula 7]

$$HO-\underset{R^9}{\overset{R^8}{Si}}-OH$$

wherein $R_8$ and $R_9$ are each independently selected from an alkyl group of C1~C20, a cycloalkyl group of C3~C8, an alkyl group of C4~C20 substituted with a cycloalkyl group of C3~C8, an alkenyl group of C2~C20, an alkynyl group of C2~C20, and an allyl group of C6~C20, and $R_8$ and $R_9$ each independently have at least one functional group selected from an acryl group, a methacryl group, an allyl group, a halogen group, an amino group, a mercapto group, an ether group, an ester group, an alkoxy group of C1~C20, a sulfone group, a nitro group, a hydroxy group, a cyclobutene group, a carbonyl group, a carboxyl group, an alkyd group, a urethane group, a vinyl group, a nitrile group, and an epoxy.

12. The fluorescent dye-siloxane hybrid resin according to claim 11, wherein the organo-silanediol is selected from diphenylsilanediol, diisobutylsilanediol, and a mixture thereof.

13. The fluorescent dye-siloxane hybrid resin according to claim 1, wherein the polycondensation reaction is a sol-gel reaction.

14. The fluorescent dye-siloxane hybrid resin according to claim 1, wherein the fluorescent dye-siloxane hybrid resin includes a thermocurable or ultraviolet-curable functional group.

15. A light wavelength converter, laser, color filter, solar cell, or LED device manufactured using the fluorescent dye-siloxane hybrid resin of claim 1.

16. A fluorescent dye-siloxane hybrid resin composition comprising the fluorescent dye-siloxane hybrid resin of claim 1.

17. The fluorescent dye-siloxane hybrid resin composition according to claim 16, wherein the composition further comprises a curing agent for thermal curing or ultraviolet curing.

18. The fluorescent dye-siloxane hybrid resin composition according to claim 16, wherein the composition further comprises a monomer having a thermocurable or ultraviolet-curable functional group.

19. The fluorescent dye-siloxane hybrid resin composition according to claim 16, wherein the composition further comprises a side reaction adjuster and a solvent for improving curability and controlling viscosity.

20. The fluorescent dye-siloxane hybrid resin composition according to claim 16, wherein the composition further comprises at least one selected from the group consisting of a quantum dot, an inorganic phosphor, a conjugated polymer, a surfactant, an antioxidant, an active oxygen remover, a silica sol, oxide or nitride nanoparticles, a flameproofing agent, a metal filler, and a heat-resisting agent.

* * * * *